United States Patent
Matsumoto

(10) Patent No.: US 7,218,201 B2
(45) Date of Patent: May 15, 2007

(54) HIGH PRESSURE RESISTANCE BODY ELEMENT

(75) Inventor: Kesafumi Matsumoto, Atsugi (JP)

(73) Assignee: Kouken Company, Limited, Kanagawa (JP)

( * ) Notice: Subject to any disclaimer, the term of this patent is extended or adjusted under 35 U.S.C. 154(b) by 184 days.

(21) Appl. No.: 10/516,233

(22) PCT Filed: Dec. 18, 2003

(86) PCT No.: PCT/JP03/16223

§ 371 (c)(1),
(2), (4) Date: Nov. 30, 2004

(87) PCT Pub. No.: WO2004/109720

PCT Pub. Date: Dec. 16, 2004

(65) Prior Publication Data

US 2006/0097840 A1    May 11, 2006

(30) Foreign Application Priority Data

Jun. 3, 2003 (JP) ............................ 2003-158195
Oct. 28, 2003 (JP) ............................ 2003-367958

(51) Int. Cl.
  *H01C 1/03* (2006.01)
(52) U.S. Cl. ............... 338/238; 338/243; 338/302; 219/544
(58) Field of Classification Search ........... 338/202, 338/203, 229, 238, 242, 243, 264, 266, 296, 338/302, 329; 219/236, 238, 530, 534, 523, 219/540, 541, 544; 392/360, 498, 503; 165/184
See application file for complete search history.

(56) References Cited

U.S. PATENT DOCUMENTS

| | | | | | |
|---|---|---|---|---|---|
| 3,578,952 | A | * | 5/1971 | Boose | 219/540 |
| 4,072,847 | A | * | 2/1978 | Craven | 219/523 |
| 4,621,251 | A | * | 11/1986 | Keefe | 338/302 |
| 6,034,354 | A | * | 3/2000 | Hironaka | 219/544 |
| 7,019,269 | B2 | * | 3/2006 | Okuda | 219/544 |

FOREIGN PATENT DOCUMENTS

| | | |
|---|---|---|
| JP | 09-015307 | 1/1997 |
| JP | 09-015308 | 1/1997 |
| JP | 2000-019231 | 1/2000 |

\* cited by examiner

*Primary Examiner*—Tu Hoang
(74) *Attorney, Agent, or Firm*—Jordan and Hamburg LLP

(57) ABSTRACT

A high-voltage resistor element which is superior to heat resistance, dielectric breakdown strength, vibration resistance and durability performance, and is advantageous to maintenance, inspection, adjustment, replacement and repair, is made up of: a cylindrical outer tube made of metal; a resistive heat-generating wire in a coiled shape tensionally extending between inner ends of electrode rods inserted respectively from both ends of the outer tube; an insulating material filing up a space between the resistive heat-generating wire with the electrode rods and the internal surface of the outer tube and fired; and insulating sleeves extractably encasing and anchored in the portions adjacent to the both ends of the outer tube penetratingly bridging between arrangement boards.

9 Claims, 4 Drawing Sheets

PRIOR ART

PRIOR ART

HIGH PRESSURE RESISTANCE BODY ELEMENT

TECHNICAL FIELD

The present invention relates to a high-voltage resistor element as a high-voltage metallic resistor to be used in load characteristic tests of a high-voltage power generator.

BACKGROUND ART

Heretofore, as a load resistor to be used in load characteristic tests of a power generator, that which employs a high-voltage resistor element 1' having a fin 9 as shown in FIG. 3 has been utilized. In the same figure, numeral 2' denotes an outer tube in a cylindrical shape, which is formed to be approximately 1 m long.

And numeral 3 denotes a resistive heat-generating wire; 4 an electrode rod; and 5' an insulating material filling up the space between the resistive heat-generating wire 3 with the electrode rod 4 and the internal surface of the outer tube 2', and hermetically sealed with an end sealing member 6. This insulating material 5' is in a powdery state, and has a function of insulating the outer tube 2' from the resistive heat-generating wire 3 with the electrode rod 4.

Numeral 7 denotes a connection terminal, which is sandwiched and fixed on both sides by nuts 8, 8 screwed onto an outer end threaded portion 4a of the electrode rod 4. And through the connection terminal 7, the high-voltage resistor element 1' is connected to another adjacent one. Numeral 9 denotes the fin as mentioned above, which functions as a heatsink to radiate the heat generated when the resistive heat-generating wire 3 is energized. The fin 9 is formed integrally with, or mounted onto the circumference of, the outer tube 2' in a spiral shape with a spacing of approximately 7 mm along its longitudinal direction.

To accommodate the operating voltage of 6,600 V, this high-voltage resistor element 1' is specified to have a rated voltage of 400 V and a dielectric strength of 2,000 V for 1 minute.

FIG. 4 shows a high-voltage resistor circuit 10 in which the high-voltage resistor elements 1' are connected in series. Numeral 11 denotes a connection member, which connects the adjacent high-voltage resistor elements 1' to each other in place of the connection terminal 7. Numeral 12 denotes a rectangular frame in a box shape, and between arrangement boards 12a' of this rectangular frame 12, both ends of ten (10) high-voltage resistor elements 1' are penetratingly bridged to form the high-voltage resistor circuit 10.

FIG. 5 shows a schematic configuration of a high-voltage load resistor unit 13. In the high-voltage load resistor unit 13, the above-mentioned high-voltage resistor circuits 10 are bridgingly housed in multiples of fifteen (15) columns. In this case, the high-voltage resistor elements 1' are disposed alternately so that the fins 9 of the high-voltage resistor elements 1' do not overlap one upon another. This is because, when each of the high-voltage resistor elements 1' is energized, extremely high heat is generated, and thus air cooling must be uniformly provided by a cooling fan from bottom to up.

FIG. 6 shows a practical example in which the high-voltage load resistor unit 13 is provided with a cooling fan 14. In the same figure, numeral 15 denotes a vibration-proof rubber, and 16 an insulator. By additionally providing this insulator 16, the function that further increases the ensured insulation is obtained. In the figure, numeral 17 denotes a hood, and 18 an installation base.

Here, the references in the prior art are given as follows:
Japanese Patent Laid-open No. 9-15307
Japanese Patent Laid-open No. 9-15308
Japanese Patent Laid-open No. 2000-19231

As a result of conducting the load characteristic tests of the high-voltage power generator with use of the conventional dry-type high-voltage load resistor unit 13 such above, it has been found that the temperature of the high-voltage load resistor unit 13 as air-cooled has risen to 140 degrees C. as a whole, and that of the high-voltage resistor element 1' as a unit has risen to 350 degrees C. to 700 degrees C.

This is because, if the fins 9 of the high-voltage resistor elements 1' arranged in the high-voltage resistors circuit 10 are disposed alternately so that they are not overlapped, the form of this fin 9 provides a resistance to the ventilation by the cooling fan 14, which causes the heat to be confined to within the rectangular frame 12, and thus the effect on the cooling performance of the cooling fan 14 is not sufficiently obtained. The fin 9, which is habitually provided for the high-voltage resistor element 1' of this kind, is extremely effective for use in a low-voltage resistor element, however, it has not been elucidated that the fin 9 causes various detrimental effects as described below.

Specifically, because the fin 9 provides a resistance to the ventilation, an air turbulence and a disturbed air stream are produced in the high-voltage load resistor unit 13, and thus the vibration phenomena that occur as a result thereof is unavoidable. In the prior art example, this phenomena is avoided by use of the vibration-proof rubber 15, however, the hazard in the tests cannot yet be eliminated.

Moreover, because the insulating material 5' hermetically sealed in the outer tube 2' of the high-voltage resistor element 1' is in a powdery state, it shifts to one side by such an external force vibration, which results in the impossibility of realizing a uniform thickness covering and the partial insufficiency of the insulation, and finally acts as a trigger for a dielectric breakdown. In addition, because of the powdery state, the resistive heat-generating wire 3 being red hot in operation can easily burnout or disconnect by the vibration, which results in the lack of a heat resistance. Nevertheless, the cause of troubles, which was often brushed off as an erroneous operation made by the operator, has not been thoroughly elucidated.

Furthermore, because the form of the fin 9, which is designed for the heat radiating effect, is tipped, when the voltage is raised, sharp edges 9a, 9a, . . . (see FIG. 3) initially generate corona discharges and finally generate arc discharges with the rectangular frame 12, which result in dielectric breakdown. This fact has been found finally as a result of experiments conducted over many years. Thus, with the conventional high-voltage resistor element 1', it has been impossible to carry out the load characteristic tests without involving hazard.

As a safety measure against the dielectric breakdown resulting from the arc discharges, the insulator 16 is provided, however, because there is no place for high-voltage overcurrent to escape, the entire high-voltage load resistor unit 13 can be burnt down, and because of this hazard, the operator could not come near to it during the operation.

In addition, the fin 9 makes it difficult to see inside the rectangular frame 12 from above, which presents an interference in maintenance, inspection and adjustment, and further, because only the burnt or disconnected high-voltage resistor element 1' cannot be laterally extracted from the rectangular frame 12, a partial replacement could not be carried out on the working site. And every time there arose the need for the partial replacement, the entire high-voltage load resistor unit 13 had to be brought back to the plant for removing the other high-voltage resistor elements 1' before carrying out the required partial replacement, which causes the interruption and postponement of the load characteristic tests.

Here, the major objects of the present invention to be achieved are as follows:

Specifically, a first object of the present invention is to provide a high-voltage resistor element which can withstand the temperature rise due to the heat generated in conducting load characteristic tests of a high-voltage power generator.

A second object of the present invention is to provide a high-voltage resistor element for use in a high-voltage load apparatus which is to be free from dielectric breakdown even at a high voltage.

A third object of the present invention is to provide a high-voltage resistor element which is superior to vibration resistance due to air cooling. highly durable A fourth object of the present invention is to provide a high-voltage resistor element which can be easily extracted one by one from a supporter and accordingly has advantageous to maintenance, inspection, adjustment, replacement and repair.

A fifth object of the present invention is to provide a high-voltage resistor element which is lightweight and compact.

Other objects of the present invention will be naturally apparent from the description, drawings, and especially the claims.

DISCLOSURE OF INVENTION

In order to achieve the above-mentioned objects, the present invention provides unique configuration means which, with use of an insulating sleeve for extractably encasing the portion in an outer tube of a high-voltage resistor element in which the portion is to be supported by a supporter, sufficiently increases vibration resistance and dielectric breakdown with no spiral fin being provided for the circumference over the full length, improves the ventilation by a cooling fan, and is formed so as to have a vibration resistant construction.

To be more specific, the present invention achieves the above-mentioned objects by employing the following novel and unique configuration means.

Specifically, a first feature of the present invention is to employ the structure of a high-voltage resistor element comprising: a cylindrical outer tube made of metal; a resistive heat-generating wire wound spirally and extending between inner ends of electrode rods inserted respectively from both ends of the outer tube; an insulating material filling up the space between the resistive heat-generating wire with the electrode rods and the internal surface of the outer tube and fired; and insulating sleeves extractably encasing and anchored in the portions adjacent to the both ends of the outer tube to be supported by various supporters.

A second feature of the present invention is to employ the structure of a high-voltage resistor element, wherein the insulating sleeve in the above-stated first feature of the present invention is anchored, by means of a spring grooved retaining ring, to the outer tube.

A third feature of the present invention is to employ the structure of a high-voltage resistor element, wherein the insulating sleeve in the above-mentioned first or second feature of the present invention is extractably anchored, by means of a spring grooved retaining ring, to an arrangement board which is a supporter in arranging the high-voltage resistor elements in multiple rows and multiple columns.

A fourth feature of the present invention is to employ the structure of a high-voltage resistor element, wherein the insulating sleeve in the above-mentioned first or second feature of the present invention is cylindrical.

A fifth feature of the present invention is the adoption of the structure of a high-voltage resistor element, wherein the length and the thickness of the insulating sleeve in the above-mentioned first or second feature of the present invention are adjustably formed so that the insulating sleeve has a dielectric strength in accordance with a value of high voltage to be applied.

A sixth feature of the present invention is to employ the structure of a high-voltage resistor element, wherein the insulating sleeve in the above-mentioned fifth feature of the present invention is around and approximately 10 cm long.

A seventh feature of the present invention is to employ of the structure a high-voltage resistor element, wherein the insulating sleeve in the above-mentioned fifth feature of the present invention is around and approximately 3 mm thick.

An eighth feature of the present invention is to employ the structure of a high-voltage resistor element, wherein the insulating sleeve in the above-mentioned first or second feature of the present invention is made of sintered ceramic.

A ninth feature of the present invention is to employ the structure of a high-voltage resistor element, wherein a currently used external sheath for low voltage use serving as an overall protective cover for the insulating material in the above-mentioned first or second feature of the present invention is employed as the outer tube, the external sheath having no spiral fin and being superior to heat resistive characteristic.

A tenth feature of the present invention is to employ the structure of a high-voltage resistor element, wherein the insulating material having filled up and been fired in the above-mentioned first or second feature of the present invention becomes solidified and encompassingly protects the resistive heat-generating wire to be embedded therein against vibration.

An eleventh feature of the present invention is to employ the structure of a high-voltage resistor element, wherein the electrode rod in the above-mentioned first or second feature of the present invention is a conductive metal rod.

When such a high-voltage resistor element of the present invention is used with a high-voltage load resistor in the prior art example for carrying out the tests, the insulating sleeve, which is cylindrical, allows good ventilation by the cooling fan with no air turbulence and disturbed air stream being generated in the rectangular frame, thus providing a sufficient heat reduction effect, as compared to the prior art example.

The cylindrical form gives no resistance to the ventilation, and assures a smooth flow of the ventilation up to the top of the resistor unit; because of the elimination of the spiral fin, the inside of the rectangular frame can be easily seen through from above the resistor unit; and removing the spring grooved retaining rings allows any particular high-voltage resistor element to be easily extracted from the rectangular frame, which is extremely convenient for maintenance, inspection, adjustment and repair on the working site.

In addition, this fact suppresses the occurrence of vibration, eliminates the need for vibration-proof rubbers, and mitigates considerably hazard in the tests. Further, the absence of sharp edges of protrusions like the fins used in the prior art example, increases dielectric strength, and enables to avoid the hazard of dielectric breakdown; and the fixation of a high-voltage resistor element to a supporter by means of the insulating sleeve encasing the same contributes further to blocking dielectric breakdown and other advantageous effects.

BEST MODE FOR CARRYING OUT THE INVENTION

An embodiment of the present invention will be described with reference to the drawings.

Figure 1:
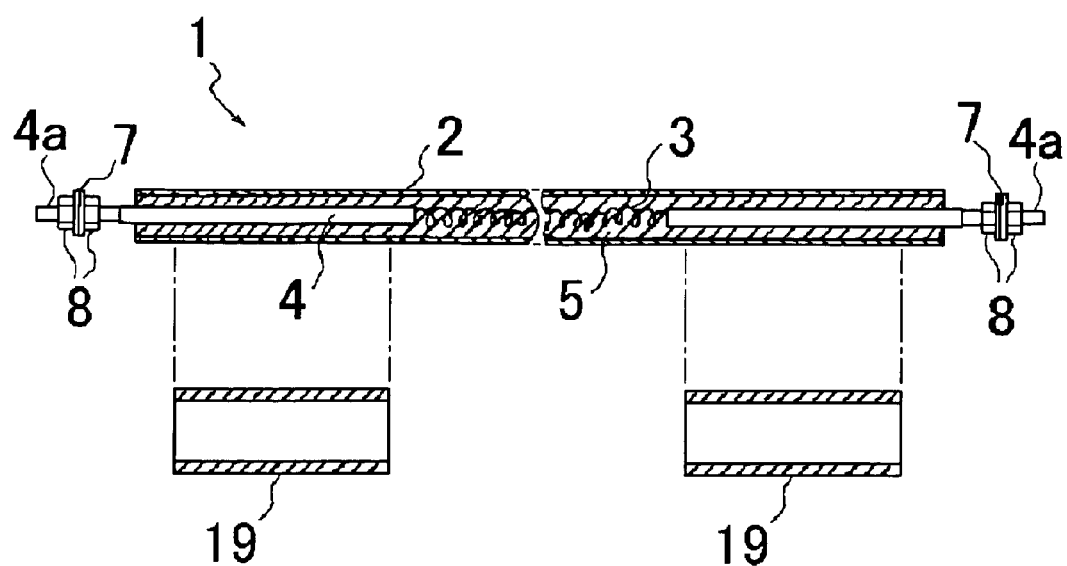
FIG. 1 is a fragmentary cutaway side view illustrating a high-voltage resistor element from which an insulating sleeve is disassembled and removed according to the embodiment of the present invention.
Figure 2:
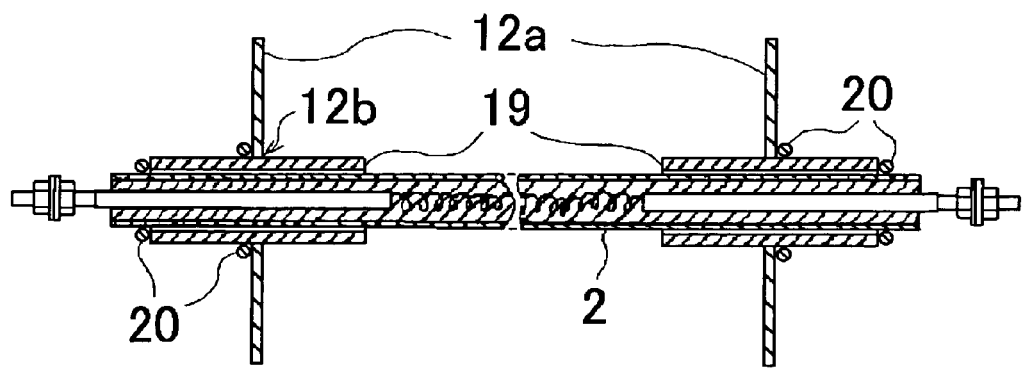
FIG. 2 is a fragmentary cutaway side view illustrating the state of fixation of the high-voltage resistor element to arrangement boards according to the embodiment the present invention to arrangement boards.
Figure 3:
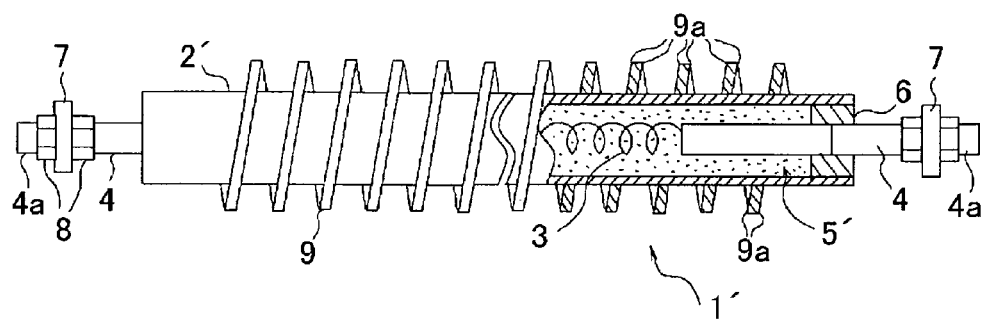
FIG. 3 is a fragmentary cutaway side view illustrating a conventional high-voltage resistor element.
Figure 4:
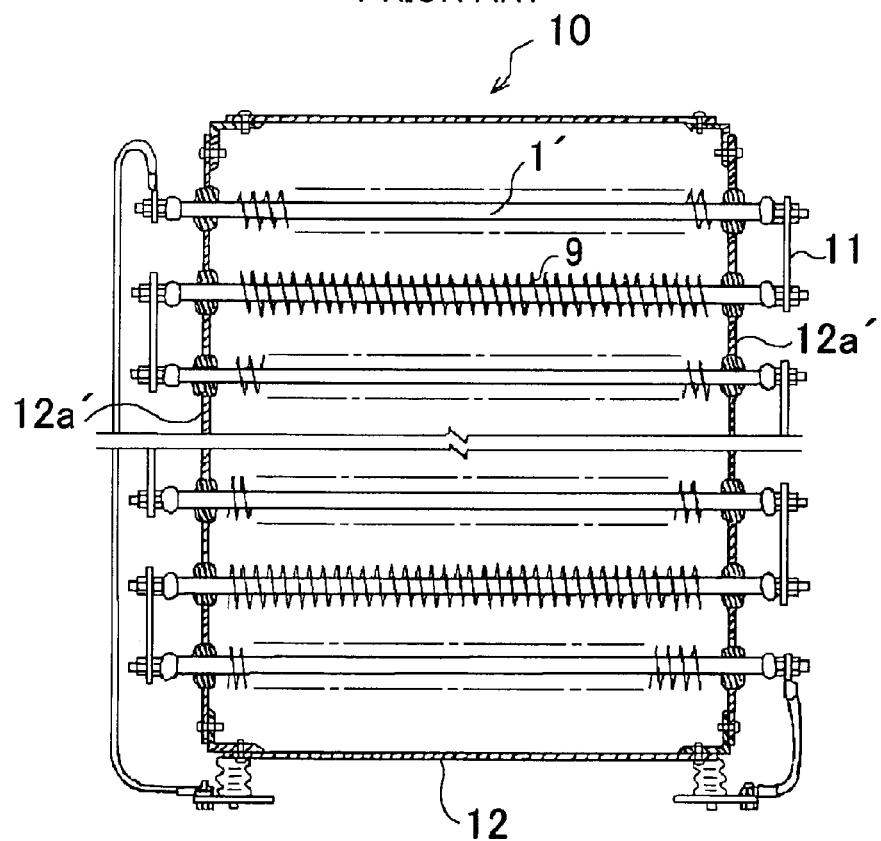
FIG. 4 is a fragmentary cutaway plan view illustrating a high-voltage resistors circuit formed by conventional high-voltage elements connected in series and penetratingly bridging in a rectangular frame.

FIG. 1 is a fragmentary cutaway side view illustrating a high-voltage resistor element from which an insulating sleeve is disassembled and removed according to the embodiment of the present invention, and FIG. 2 is a fragmentary cutaway side view illustrating a high-voltage resistor element, both ends of which are penetratingly bridged between arrangement boards.

In the present embodiment, however, identical parts are marked with the identical numerals, and some of them without prime(') denote the corresponding parts in the prior art example.

In the figures, numeral 1 denotes a high-voltage resistor element in the present embodiment; and 2 an outer tube made of metal, which employs a currently used external sheath for low voltage use serving as an overall protection cover for an insulating material 5, in which the surface is formed smooth to suppress the occurrence of discharges, and which is superior to heat radiation characteristic without any spiral fin. Numeral 3 denotes a resistive heat-generating wire in a coiled shape tensionally extending between inner ends of electrode rods 4, 4 inserted respectively from both ends of the outer tube 2.

And numeral 5 denotes an insulating material like 5' in the prior art example, however, the insulating material 5 is made from powder material which is heated to be fired and solidified, filling up the space between the internal surface of the outer tube 2 and electrode rods 4, 4 made of conductive metal with the resistive heat-generating wire 3. Accordingly, the insulating material 5 not only evenly insulates the outer tube 2 from the electrode rods 4, 4 with the resistive heat-generating wire 3, but also produces an effect of absorbing the vibration energy from the external for firmly fixing the resistive heat-generating wire 3 which is weak in self-supporting power.

In addition, unlike the conventional insulating material 5', the insulating material 5 is solidified; therefore, it will not shift to one side even if subjected to vibrations from the outside, thus the ensured insulation can be reasonably expected. Numeral 7 denotes a connection terminal which is engaged with an outer end threaded portion 4a of the electrode rod 4, being sandwiched and fixed on both sides by nuts 8, 8.

Numeral 19 denotes an insulating sleeve which is characteristic of the present embodiment. The insulating sleeve 19 consists of a sintered ceramic which is superior to electrical withstand voltage, heat resistance, water resistance (when the tests are conducted outdoors, quenching by rain water or the like may cause fracture), load resistance and shock resistance. Using a material having a withstand voltage of 12,000 VAC/mm for 1 minute as an electric characteristic and a thickness of 3 mm for example, the one having a dielectric strength of 36,000 VAC for 1 minute can be manufactured.

In addition, the form of the insulating sleeve 19 is cylindrical, and assuming that the outside diameter of the high-voltage resistor element 1 is 12 mm for example, the inside diameter of the insulating sleeve 19 will be 12.5 mm or so, and the outside diameter thereof will be 18.5 mm or so, in case that the thickness is 3 mm. The length and thickness should be adjusted in accordance with the operating voltage.

Further, as shown in FIG. 2, the lengths of the penetrations of the insulating sleeve 19 from the holding hole 12b in arrangement board 12a are 50 mm or so, respectively, in consideration of the possible reduction in dielectric strength due to soils on the surface and moisture.

Meanwhile, these values are only exemplary, and the dimensions are, of course, not limited to these values. In FIG. 2, numeral 20 denotes a spring grooved retaining ring, which anchors the extractable insulating sleeve 19 to the holding hole 12b in the arrangement board 12a, while anchoring the outer tube 2 being extractable to the insulating sleeve 19.

Figure 5:
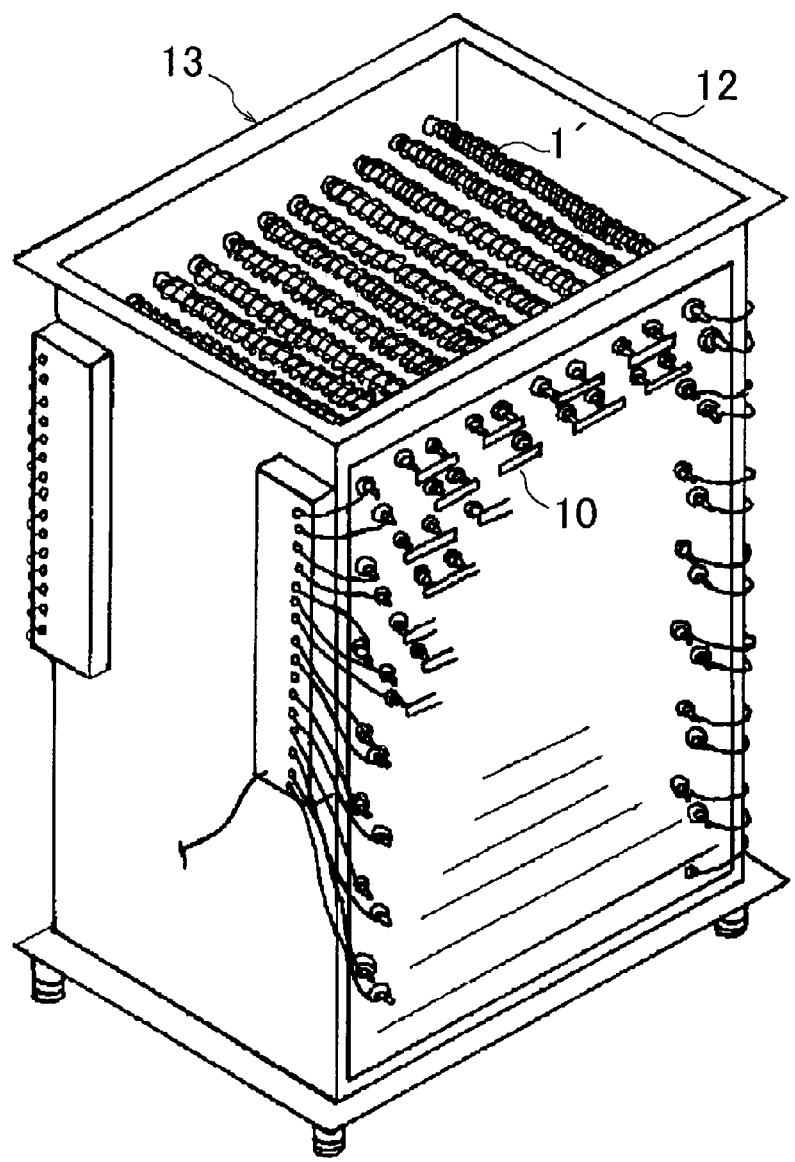
FIG. 5 is a perspective view illustrating a conventional high-voltage load resistor unit.
Figure 6:
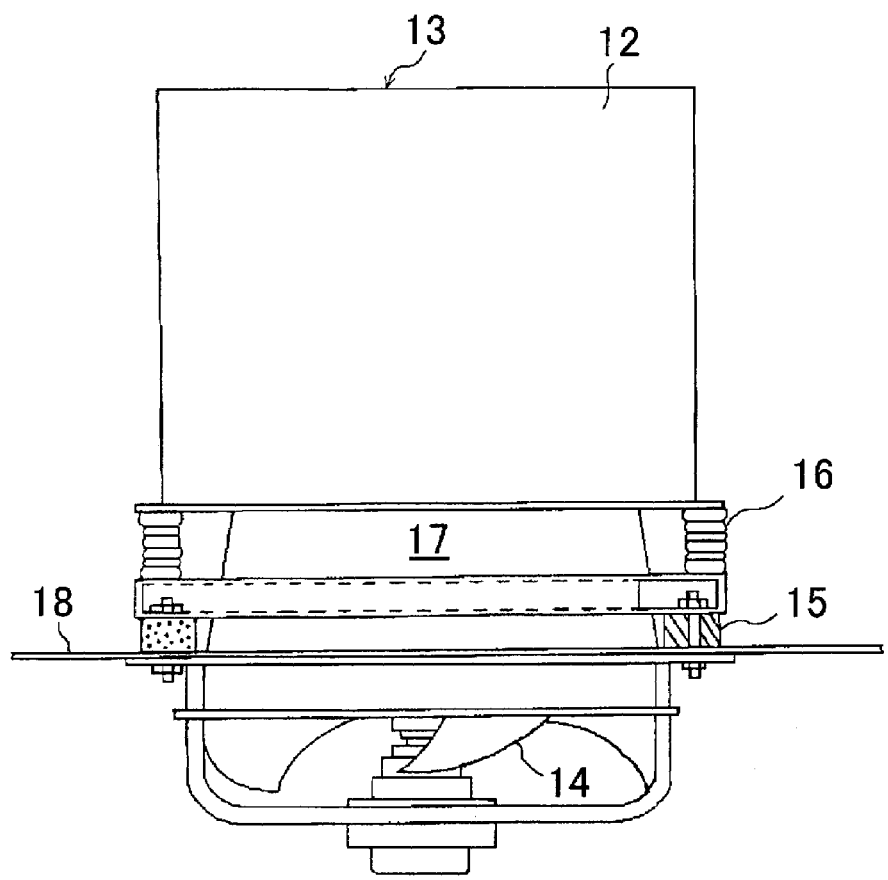
FIG. 6 is a side view illustrating a conventional high-voltage load resistor unit at the bottom of which a cooling fan is attached through insulators and vibration-proof rubbers.

The arrangement board 12a corresponds to the arrangement board 12a' of the rectangular frame 12 shown in FIG. 5 illustrating the prior art example of the high-voltage resistors circuit 10, and can be a supporter in forming the high-voltage resistors circuit 10 with a group of the high-voltage resistor elements 1 penetratingly bridged therebetween on both ends, which has become substantially smaller due to the elimination of a fin 9.

Accordingly, the rectangular frame 12 bridgingly housing the high-voltage resistor elements 1 made lighter and more compact itself becomes smaller.

So far above, the embodiment of the present invention has been described, however, the present invention is not necessarily limited to the above-mentioned means, but can be appropriately altered and carried out within the scope of which the objects of the present invention can be achieved and the above-mentioned advantageous effects can be attained.

The invention claimed is:
1. A high-voltage resistor element comprising:
a cylindrical outer tube made of metal and having an outer peripheral surface that is without any spiral fin;
electrode rods inserted respectively from both ends of said outer tube;

a resistive heat-generating wire wound spirally and extending between inner ends of said electrode rods;

a solidified insulating material filling a space within an internal surface of said outer tube so as to encase said resistive heat-generating wire and said electrode rods; cylindrical insulating sleeves being without any fin;

said insulating sleeves extractably encasing and being anchored at respective portions of the outer peripheral surface of said cylindrical outer tube, said respective portions being adjacent to the both ends of the outer peripheral surface of said outer tube; and said insulating sleeves being positioned between said outer tube and one or more supporters and so that said outer said high-voltage resistor element is supported by the one or more supporters.

2. The high-voltage resistor element of claim 1, further comprising a spring grooved retaining ring for anchoring said insulating sleeves to said outer tube.

3. The high-voltage resistor element of claim 1, wherein said high-voltage resistor element comprises a plurality of high-voltage resistor elements, each further comprising a spring grooved retaining ring for extractably anchoring said insulating sleeves to an arrangement board, and the arrangement board comprising said one ore more supporters for arranging said high-voltage resistor elements in multiple rows and multiple columns.

4. The high-voltage resistor element of claim 1 or 2, wherein a length and a thickness of said insulating sleeves are adjustably formed so that said insulating sleeves have a dielectric strength in accordance with a value of voltage to be applied.

5. The high-voltage resistor element of claim 4, wherein said insulating sleeves are approximately 10 cm long.

6. The high-voltage resistor element of claim 4, wherein said insulating sleeves are approximately 3 mm thick.

7. The high-voltage resistor element of claim 1 or 2, wherein said insulating sleeves comprise sintered ceramic.

8. The high-voltage resistor element of claim 1 or 2, wherein said outer tube comprises a heat resistive external sheath forming a protective cover for said insulating material, said external sheath having no spiral fin.

9. The high-voltage resistor element of claim 1 or 2, wherein said electrode rods comprise conductive metal.

* * * * *